WIDEBAND STABILIZED AMPLIFIER

Filed Sept. 20, 1962 2 Sheets-Sheet 1

INVENTOR.
DAVID J. CARLSON
BY Eugene M. Whitacre
Attorney

WIDEBAND STABILIZED AMPLIFIER

Filed Sept. 20, 1962 2 Sheets-Sheet 2

INVENTOR.
DAVID J. CARLSON
BY
Eugene M. Whitacre
Attorney

United States Patent Office 3,253,229

Patented May 24, 1966

3,253,229

WIDEBAND STABILIZED AMPLIFIER

David J. Carlson, Princeton, N.J., assignor to Radio Corporation of America, a corporation of Delaware Filed Sept. 20, 1962, Ser. No. 224,973

11 Claims. (Cl. 330—27)

This invention relates generally to electric signal amplifier circuits, and more particularly to stabilized amplifier circuits which are tunable over a range of frequencies.

A common problem in the design of tuned amplifier circuits, using either vacuum tubes or transistors, is the neutralization of the energy transfer through the inherent feedback capacitance between either the grid and plate circuits of the vacuum tube or the collector and base circuits of the transistor, as the case may be. Several of the circuits used to produce the desired neutralization in vacuum tube amplifiers employ a neutralizing capacitance connected between the grid electrode and the plate electrode of the tube in such a way that the current passing through the neutralizing capacitor is of the proper amplitude and phase to neutralize exactly the transfer of energy between the input and output circuits of the amplifier through the inherent grid-plate tube capacitance.

In general, the neutralizing circuits can be considered as bridge circuits in which the output and input circuits are connected across the opposite diagonals. When the neutralization is so adjusted as to balance the bridge, the input circuit receives no energy from the output tuned circuit because the two are in electrically neutral locations with respect to each other.

A capacitive bridge type of neutralization circuit provides relatively broadband stabilization of a tunable amplifier when inductive elements are used as the tuning means, but when a variable capacitor is utilized as the tuning means, the bridge formed by the capacitors becomes unbalanced when the output circuit is tuned to a different frequency and wide band neutralization is not achieved.

Accordingly, it is an object of this invention to provide an improved neutralizing circuit for tunable amplifiers which maintains amplifier stabilization over a wide range of frequencies.

It is another object of this invention to provide an improved capacity bridge neutralizing circuit for a broadband, high frequency tuned amplifier employing capacitive tuning.

It is still a further object of this invention to provide an improved neutralizing circuit for a tuned amplifier operable in the VHF and UHF bands.

An example of a stabilized amplifier according to the invention includes a plural electrode amplifier device, such as a vacuum tube or transistor, having inherent capacitance between the output and input electrodes. Input signals having a predetermined frequency range are applied between the input and common electrodes. The amplifier output circuit comprises a first and second reactive elements one of which is variable to tune the amplifier output circuit to a selected signal frequency.

A neutralizing bridge circuit for the amplifier includes the inherent capacitance of the amplifier device, the first and second reactance elements and reactive circuit means. The latter three elements are connected in series in the order named between the output electrode and the input electrode. The reactive circuit means comprises a resonant circuit tuned to a frequency above or below the resonant frequency of the output circuit by an amount to present an effective reactance at the output circuit resonant frequency which balances the bridge. When the bridge circuit is balanced no energy is fed back from the output circuit to the input circuit of the amplifier through the inherent feedback capacitance. As the variable reactance element is adjusted to tune the output circuit to a different frequency, the reactive circuit means leg of the bridge exhibits a different value of reactance at the different frequencies to keep the bridge balanced.

Figures 1, 2, 3:
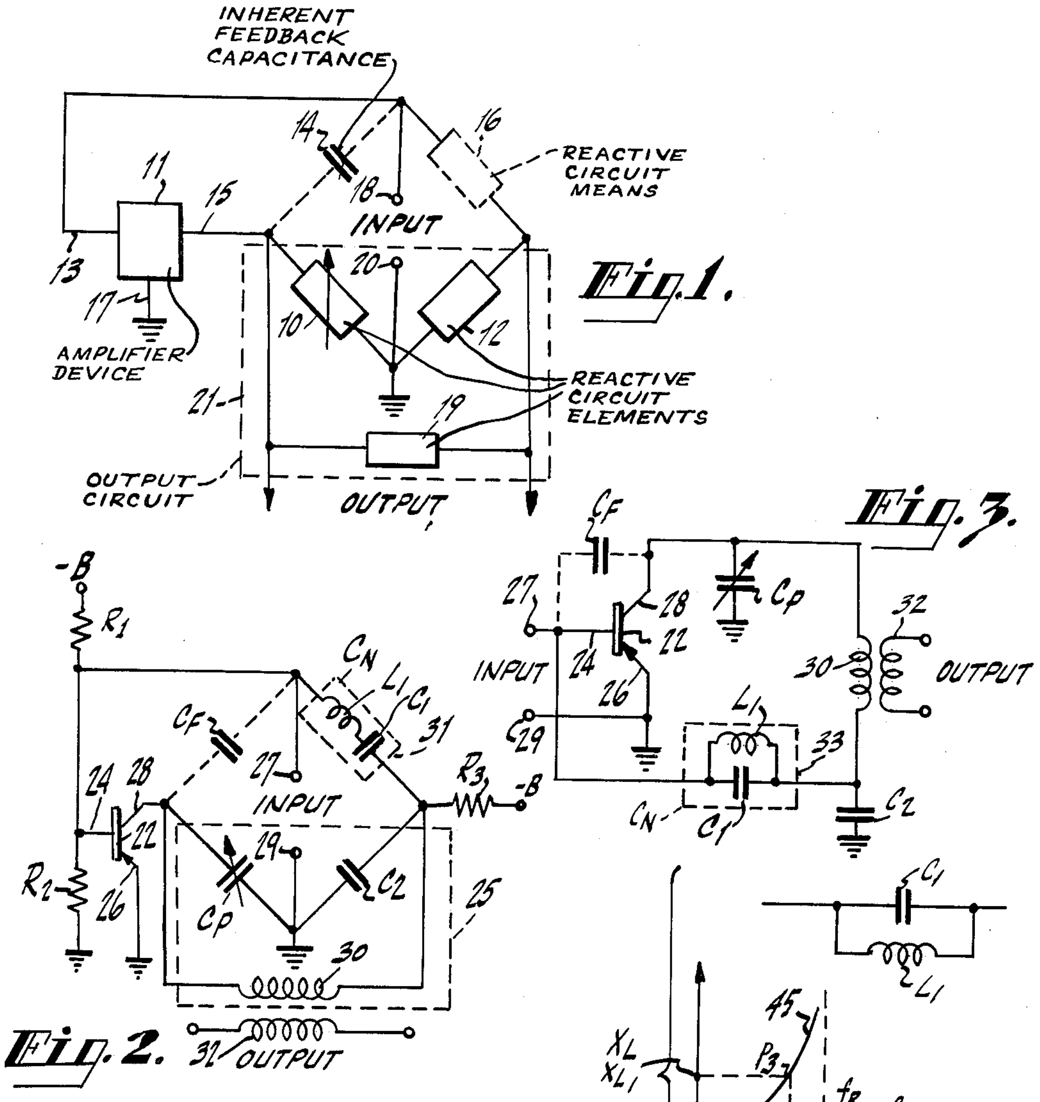
FIGURE 1 is a block diagram of an amplifier circuit including a bridge type neutralizing network according to the invention.
FIGURE 2 is a schematic diagram of a transistor amplifier circuit embodying the invention, and employing capacitance tuning and having a neutralizing network.
FIGURE 3 is a schematic diagram of a transistor amplifier according to the invention which is stabilized by another version of a neutralizing network.

Referring to FIGURE 1, there is shown an amplifier device 11 having an input electrode 13, an output electrode 15 and a common electrode 17. The common electrode 17 is connected to a point of reference potential, shown as ground. The amplifier device 11 has inherent feedback capacitance 14 between its input electrode 13 and its output electrode 15.

Input signals are applied to the amplifier device between terminals 18 and 20, which are respectively connected to the input electrode 13 of the amplifier device 11 and to ground.

An output circuit 21 is connected to the output electrode 15 of the amplifier device 11. The output circuit 21 comprises the combination of a variable reactive circuit means 10 in parallel with a series network comprising a reactive circuit means 19 and a reactive circuit means 12. The reactive circuit means 10 and 12 are both connected to ground. Signals developed across reactive circuit means 19, may be coupled to utilization circuit means, not shown, in any suitable manner.

Reactive circuit means 16 is connected between the input electrode 13 of amplifier device 11, and the connection between the reactive circuit means 19 and 12.

The output circuit 21 is tuned to a desired frequency by varying the reactive circuit means 10. The reactive circuit means 16 is resonant at a frequency that is outside the range of frequencies to which the output circuit 21 is tuned. The reactive means 10, 12, 14, and 16 can be considered as a bridge circuit in which the output and input circuits are connected across opposite diagonals. When the bridge is balanced, the input circuit does not receive energy from the output circuit through the inherent feedback capacitance 14.

The condition for balance of the bridge is that the ratio of the reactance of the reactive means 10 to the capacitance 14 is equal to the ratio of the reactance of reactive means 12 to the effective reactance of reactive means 16.

In operation, as the capacitance or inductance of the reactive circuit means 10 is varied, the output circuit 21 is tuned at a different frequency. Because the reactive network 16 is resonant at a frequency which is different from the frequency of resonance of the output circuit 21, its effective reactance varies as a function of the resonance of the output circuit. The change in the effective or bridge balancing reactance of the reactive means 16 is a function of the variation in the reactance of the reactive means 10 and the bridge is maintained in balance.

Referring to FIGURE 2, there is shown, by way of example, the radio frequency (R–F) amplifier stage of a wide band variable capacitor tuner suitable for use in VHF and/or UHF television tuners. The R–F amplifier comprises a transistor 22 having a base electrode 24, an emitter electrode 26, and a collector electrode 28. The transistor 22 has inherent feedback capacitance $C_f$ between its base and collector electrodes 24 and 28.

Input signals are applied between input terminals 27 and 29, which are respectively connected to the base electrode 24 of transistor 22, and to a point of reference potential shown as ground. The emitter electrode 26 of transistor 22 is also connected to ground.

An output circuit 25 is connected to the collector electrode 28 of transistor 22. The output circuit 25 comprises a variable capacitor $C_p$, connected between the collector electrode 28 and ground, and an inductor 30 connected in series with a fixed capacitor $C_2$. The inductor 30 is connected to the collector electrode of transistor 22, and the capacitor $C_2$ is connected to ground. The output circuit is tunable at the desired frequency by the variable capacitor $C_p$. An inductor 32 is inductively coupled to inductor 30 to couple signal energy from the R–F amplifier.

The neutralizing bridge includes the capacitances $C_f$, $C_p$, $C_2$ and a network 31 connected between the base electrode 24 of transistor 22 and the connection between inductor 30 and capacitor $C_2$. The network 31 comprises a capacitor $C_1$ and an inductor $L_1$ connected in series with each other.

The circuit shown in FIGURE 2 may be D.C. biased in any suitable manner, for example by coupling the connection of capacitor $C_2$ and inductor 30 to a source of bias potential —B through a resistor $R_3$. The operating point of the amplifier may be selected by a voltage divider network comprising resistors $R_1$ and $R_2$ connected in series with a source of bias potential —B. The base electrode 24 of transistor 22 is connected to the connection of resistors $R_1$ and $R_2$. It is to be understood that the positive terminal of the source of bias potential —B is connected to ground.

The network 31 has a resonant frequency which is higher than the resonant frequency of the output circuit 25, so that the network 31 exhibits a capacitive reactance characteristic at the operating frequencies of the amplifier.

Figure 4:
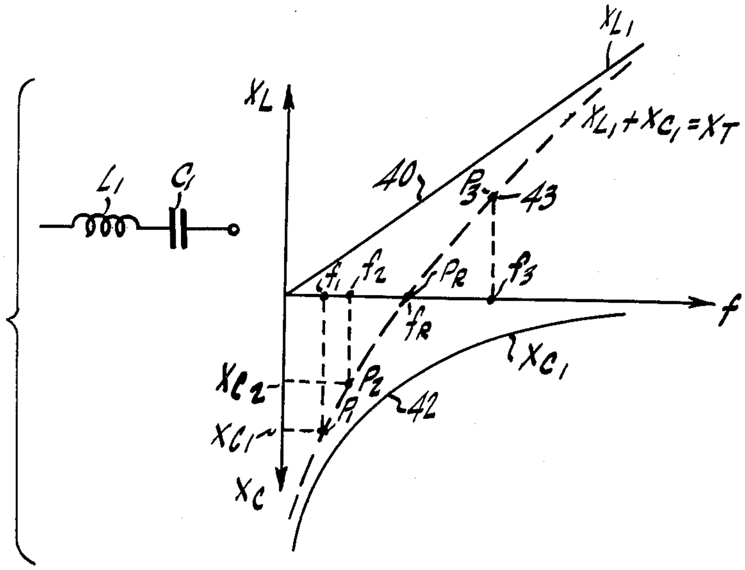
FIGURE 4 is a graph showing the reactance versus frequency characteristic of a series LC network.

Referring to FIGURE 4, there is shown the idealized reactance versus frequency characteristic of a series LC network having an inductance $L_1$ and a capacitance $C_1$. The reactance $X_{L_1}$ exhibited by the inductor $L_1$ as the frequency is varied, is shown by the line 40. The reactance $X_{C_1}$ exhibited by the capacitor $C_1$ as the frequency is varied, is shown by the solid curve 42. By adding the reactance values represented by the line 40 and the curve 42 the dotted curve 43 is obtained. The curve 43 represents the variation of the total reactance $X_T=X_{L1}+X_{C1}$ exhibited by the $L_1C_1$ network, as the frequency is varied. At a point $P_R$, the resonant point, the reactance $X_T$ is equal to zero. The network $L_1C_1$ exhibits capacitive reactance at frequencies below resonance as shown, for example, by point $P_1$, and it exhibits inductive reactance at frequencies above resonance, as shown, for example, by point $P_3$.

When the bridge neutralizing circuit in FIGURE 2 is balanced, the output circuit 25 does not transfer energy back to the input circuit through the feedback capacitor $C_f$. The condition for balancing the bridge at the maximum and minimum frequencies to which the amplifier may be tuned, may be expressed by the equality $$\frac{C_f}{KC_p}=\frac{C_{N/K}}{C_2} \qquad (1)$$

where: $C_N$ is the necessary capacitance that the neutralizing network 31 must exhibit to balance the bridge at the maximum frequency to be tuned, and K is the ratio of the maximum value of capacitor $C_p$ to the minimum value of same capacitor $C_p$, if the feedback capacitance $C_f$ and the effective neutralizing capacitance $C_N$ are neglected.

In operation, when capacitor $C_p$ is varied, the output circuit 25 is tuned to a different frequency. For example, let us assume that the output circuit is tuned to a frequency $f_2$ and that the neutralizing circuit 31 is resonant at a frequency $f_R$, as shown in FIGURE 4. If capacitor $C_p$ is increased, then the output circuit 25 is tuned at a frequency $f_1$ (which is lower than the frequency $f_2$).

The neutralizing network 31 exhibits a capacitive reactance $X_{C_1}$ at a frequency $f_1$, and a capacitive reactance $X_{C_2}$ at a frequency $f_2$. As shown in FIGURE 4, $X_{C1}$ is larger than $X_{C_2}$. An increase in the exhibited capacitive reactance means a decrease in the value of effective capacitance since;

$$X_{C_1}=\frac{1}{\omega C_1}$$

As shown by Equation 1, a change of the tuning capacitor $C_p$, by the factor K, results in a change of the capacitance exhibited by the neutralizing network 31 by a factor 1 K. In Equation 1 $C_N$ is defined as the necessary capacitance to balance the bridge at the highest operating frequency.

The necessary change of $C_N$, to maintain tracking of the changes in the tuning capacitor $C_p$ is obtained by designing the inductor $L_1$ and the capacitor $C_1$ as a function of the capacitance range of the capacitor $C_p$, and the maximum and minimum frequencies at which the circuit is operated. The equations to satisfy this condition are as follows:

At a frequency $f_2$, the maximum frequency of operation, the reactance of the neutralizing network 31 is:

$$-\omega_2L_1+\frac{1}{\omega_2C_1}=\frac{1}{\omega_2C_N} \qquad (2)$$

At a frequency $f_1$, the minimum frequency of operation, the reactance of network 31 is:

$$-\omega_1L_1+\frac{1}{\omega_1C_1}=\frac{K}{\omega_1C_N} \qquad (3)$$

Multiplying Equation 2 by $-\omega_1$ and Equation 3 by $\omega_2$ and then by algebraically adding the two equations the value of $C_1$ is found to be equal to:

$$C_1=C_N\frac{\omega_2^2-\omega_1^2}{K\omega_2^2-\omega_1^2} \qquad (4)$$

By substituting the value of $C_1$ in Equation 2 the value of $L_1$ is found to be equal to:

$$L_1=\frac{K-1}{C_N(\omega_2^2-\omega_1^2)} \qquad (5)$$

A sample calculation of the neutralizing circuit is as follows: Assume that the feedback capacitor $C_f$=.5 pf., the fixed capacitor is 30 pf., and the minimum tuning capacitance $C_p$=5 pf., [for $V_2$ band tuning (176–216 mc.)]. $C_N$ must be equal to 3 pf. (according to Equation 1).

For tuning the output circuit at the maximum frequency (216 mc.), if $C_N$ and $C_f$ are neglected, the effective capacitance of the output circuit is:

$$C_0=\frac{C_2C_p}{C_2+C_p}=\frac{30\times 5}{35}=4.29 \text{ pf. (high frequency capacitance)}$$

The maximum $C_o$ for tuning to 176 mc. is:

$$\left(\frac{f_2}{f_1}\right)^2 \times 4.29 = 6.455$$

$$\therefore \frac{C_3C_p}{C_2+C_p} = \frac{30C_p}{30+C_p} = 6.455 \text{ pf.}$$

$$\therefore C_{p_{max.}} = 8.225 \text{ pf.}$$

$$K = \frac{C_{p_{max.}}}{C_{p_{min.}}} = \frac{8.225}{5} = 1.645$$

Substituting in Equations 4 and 5 it is found that $L_1 + .347$ μh. and $C_1 = 1.028$ pf.

Figure 5:
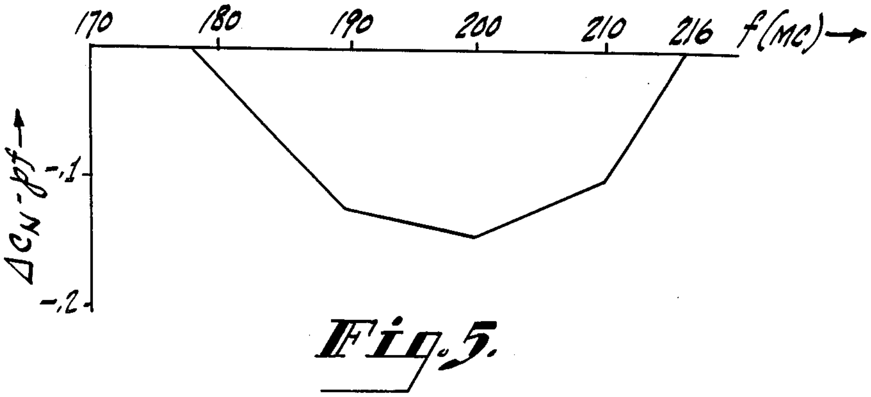
FIGURE 5 is a graph showing the variation in effective capacitance of the neutralizing network shown in FIGURE 2, as compared to the desired value of capacitance of the neutralizing network when the output circuit is tuned to different frequencies.

Referring to FIGURE 5 there is shown the tracking curve (the variation of the neutralizing capacitor $C_N$ as a function of the variation of the output circuit's resonant frequency) of a neutralizing network having the values included in the above sample calculation, operated in the $V_2$ television band (176–216 mc.).

Figure 6:
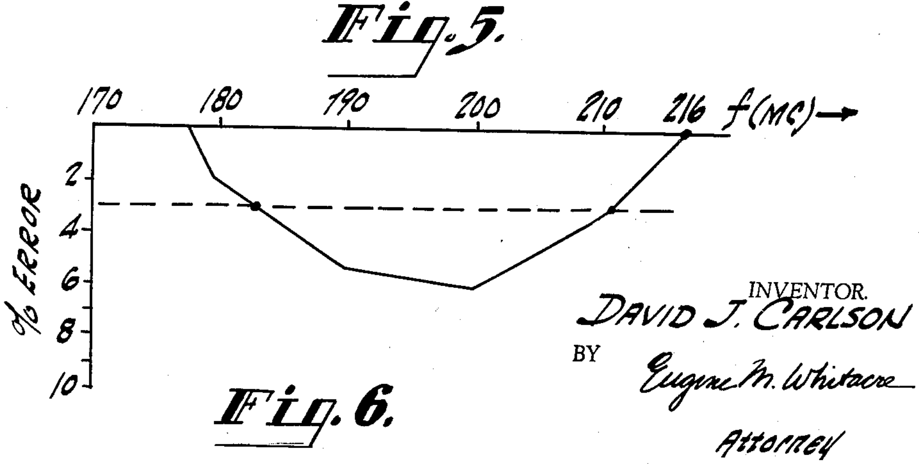
FIGURE 6 is a graph showing the percent error in the effective neutralizing capacitance from its optimum value versus frequency characteristic for the circuit shown in FIGURE 2.

FIGURE 6 shows the percent error of a typical solution of the equations relating to this circuit. As shown, the maximum error (6%) occurs at 200 mc. By proper selection in the values of $L_1$ and $C_1$, the zero error points can be shifted to frequencies between the maximum and minimum tunable frequencies as shown by the intersection of the dashed line, representative of zero percent error, and the percent error curve of FIGURE 6, to provide a maximum error of ± 3%.

The circuit shown in FIGURE 3 is identical to the circuit shown in FIGURE 2 with the exception that the series resonant leg 31 of the neutralizing bridge is replaced by a parallel resonant circuit 33. Although the direct current circuit to bias the transistor 22 at the desired operating point is not shown, it is to be understood that any suitable biasing circuit may be used, for example, the one shown in FIGURE 2.

Figure 7:
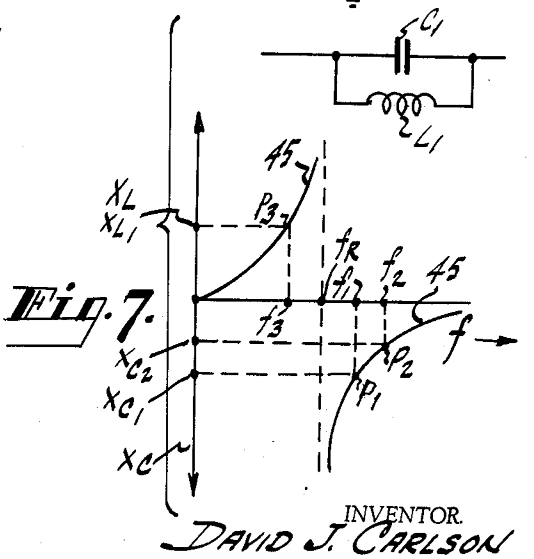
FIGURE 7 is a graph showing the reactance versus frequency characteristic of a parallel LC network.

The circuit 33 comprises an inductance $L_1$ and a capacitor $C_1$ connected in parallel with each other. As shown FIGURE 7, the curve 45 is the reactance versus frequency characteristic of a parallel LC network having values $L_1C_1$. At frequencies below the resonant frequency $f_R$, the LC network exhibits inductive reactance as shown by the point $P_3$, and at frequencies above the resonant frequency $f_R$, the LC network exhibits capacitive reactance, as shown by the points $P_1$ and $P_2$.

The neutralizing network 33 is resonant at a frequency below the range of operating frequencies, so that the network 33 always exhibits a capacitive reactance.

The condition for balance of the bridge in the circuit shown in FIGURE 3 is also $$\frac{C_f}{KC_p} = \frac{C_{N/K}}{C_2}$$

where $C_f$, $C_p$, K, $C_N$ and $C_2$ are as previously defined.

In order that the network 33 tracks the variation of the tuning capacitor $C_p$ properly, $C_1$ and $L_1$ must be designed as a function of K and of the maximum and minimum operating frequencies.

The susceptance $\omega_2 C_N$ is equal to $$\omega_2 C_1 = \frac{1}{\omega_2 L_1} \qquad (6)$$

where $\omega_2$ is the maximum operating frequency.

$$\omega_1 \frac{C_N}{K} = \omega_1 C_1 - \frac{1}{\omega_1 L_1} \qquad (7)$$

where $\omega_1$ is the minimum operating frequency.

By multiplying the simultaneous Equations 6 and 7 by $1/\omega_1$ and $1/\omega_2$ respectively, by algebraically adding them, and by solving for $C_1$, the solution of:

$$C_1 = \frac{C_N(\omega_2^2 K - \omega_1^2)}{K(\omega_2^2 - \omega_1^2)}$$

is found.

The value of $L_1$ is found by multiplying Equations 6 and 7 by $\omega_1$ and $-\omega_2$ respectively. The new equations are algebraically added, and solving for $L_1$ it is found that $$L_1 = \frac{K}{(K-1)C_N}\left(\frac{\omega_2^2 - \omega_1^2}{\omega_1^2 \omega_2^2}\right)$$

Although capacitive tuning neutralization has been shown and described, it is to be understood that the principles of the invention are also applicable to other types of bridge neutralization circuits.

The invention is equally applicable to amplifiers having the neutralizing network in the tuned input circuit.

Figure 8:
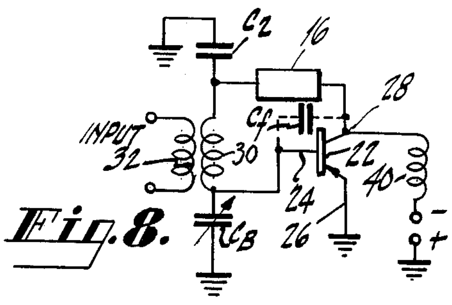
FIGURE 8 is a schematic diagram of the transistor amplifier according to the invention having the neutralizing network in its tuned input circuit.

Referring now to FIGURE 8, there is shown an amplifier similar to the one shown in FIGURES 2 and 3, but having a tunable input circuit. The input circuit of the amplifier comprises a parallel combination of a variable capacitor $C_b$ and a series network comprising inductor 30 and the fixed capacitor $C_2$. Capacitor $C_b$ includes the input capacitance of transistor 22. The base electrode 24 or transistor 22 is coupled to the connection of inductor 30 and capacitor $C_b$. Capacitors $C_2$ and $C_b$ are both connected to ground. The collector electrode 28 of transistor 22 is coupled through the neutralizing network 16 to the connection of inductor 30 and fixed capacitor $C_2$. The output circuit of the amplifier comprises an inductor 40 connected between the collector electrode 28 of transistor 22 and ground.

Input signals are applied to inductor 32 which is inductively coupled to inductor 30. The circuit shown in FIGURE 8 can be described as a bridge circuit in which the feedback capacitance $C_f$ and the variable capacitance $C_b$ comprise two legs of the bridge, and in which the neutralizing network 16 ($C_N$) and the fixed capacitor $C_2$, comprise the other two legs of the bridge.

The condition for balance of the bridge is expressed by the equality:

$$\frac{C_f}{KC_b} = \frac{C_N}{KC_2}$$

in which $C_b$ is a variable capacitor including the input capacitance of transistor 22 and the other terms are as defined in connection with the circuits shown in FIGURES 2 and 3.

The operation of the circuit shown in FIGURE 8, is similar to the operation of the circuits shown in FIGURES 2 and 3, i.e. as the capacitor $C_b$ is varied the frequency of resonance of the input circuit is varied. The reactance of the neutralizing network 16 at the resonant frequency varies as a function of the variation in capacitance of the capacitor $C_b$ and the effective capacitance $C_N/K$ varies an amount which keeps the bridge in balance.

It is to be understood that the selection of the operating point of the transistor may be done in any suitable manner, for example in the manner shown in FIGURE 2.

What is claimed is:

1. An amplifier tunable over a range of frequencies including:

a transistor having base, emitter and collector electrodes, said transistor having inherent capacitive feedback between said collector and base electrodes, an input circuit coupled between said base and emitter electrodes, an output circuit including an inductor and a fixed capacitor connected in a series circuit between said collector and emitter electrodes, and a variable capacitor connected in parallel with said series circuit, and a series resonant circuit coupled between said base electrode and the connection of said inductor and said fixed capacitor, said series resonant circuit having an LC product that is equal to $$\frac{K-1}{K\omega_2^2 - \omega_1^2}$$

and an $L/C$ ratio equal to $$\frac{(K-1)(K\omega_2^2-\omega_1^2)}{C_N^2(\omega_2^2-\omega_1^2)^2}$$

where K is equal to the ratio of the maximum value of capacitance to the minimum value of capacitance of said variable capacitor, $\omega_2$ is equal to $2\pi$ times the highest frequency of said range of frequencies, $\omega_1$ is equal to $2\pi$ times the lowest frequency of said range of frequencies, and $C_N$ is the value, at the maximum frequency of said range of frequencies, of the capacitance required to balance the bridge formed by: (1) said inherent capacitive feedback, (2) said variable capacitor, (3) said fixed capacitor, and (4) said series resonant circuit.

2. An amplifier tunable over a range of frequencies including:

a transistor having base, emitter and collector electrodes, said transistor having inherent capacitance between said collector and said base electrodes, means for applying input signals to said amplifier between said base and emitter electrodes, an output circuit coupled between said collector electrode and said emitter electrode comprising the combination of a variable capacitor in parallel with a series network including an inductor and a fixed capacitor, said output circuit being tunable at the desired frequency by varying said variable capacitor, and neutralizing means coupled between said output circuit and the input of said amplifier including an inductor and a capacitor, said inductor and capacitor respectively having a value of inductance and a value of capacitance that is a function of: (1) the ratio of the maximum value of capacitance to the minimum value of capacitance of said variable capacitor, (2) of the maximum and minimum operating frequencies, and (3) of the value, at said maximum frequency, of the effective capacitance necessary to balance the bridge formed by: (1) said inherent capacitance, (2) said variable capacitor, (3) the capacitor of said series network, and (4) said neutralizing means, so that the energy fed back through said inherent capacitance is neutralized by the energy transferred by said neutralizing means.

3. An amplifier tunable over a range of frequencies including:

a transistor having base, emitter and collector electrodes, said transistor having inherent capacitance between said collector and said base electrodes, means for applying input signals of a predetermined frequency range to said amplifier between said base and emitter electrodes, an output circuit coupled between said collector electrode and said emitter electrode comprising the combination of a variable capacitor in parallel with a series network including an inductor and a fixed capacitor, said output circuit being tunable at the desired frequency by varying said variable capacitor, and neutralizing means coupled between said output circuit and the input of said amplifier including an inductor and a capacitor connected in parallel, said neutralizing means being resonant at a frequency lower than the lowest frequency of said frequency range of input signals, said capacitor and inductor of said neutralizing means exhibiting an effective capacitive reactance that varies as a direct function of the variation of said variable capacitor, said capacitor and inductor of said neutralizing means respectively having values of capacitance and inductance such that the current flowing through said neutralizing means is of substantially the same amplitude and opposite phase from the current fed back through said inherent capacitance throughout said range of frequencies.

4. In combination:

an amplifier device having input and output electrodes, said device having inherent capacitance between said input and output electrodes, means for coupling input signals of a predetermined frequency range to said input electrode, tunable output means coupled to said output electrode including a variable reactance element in parallel with a fixed reactance network, means coupled between said output means and said input electrode including an inductor and a capacitor for neutralizing the current feedback through said inherent capacitance, said neutralizing means being resonant at a frequency outside of said frequency range of said input signals, said inductor and capacitor having values relative to one another such that the change in the reactance exhibited by said neutralizing network for a change of input signal frequency is opposite to the change in reactance of said variable reactance element to tune said tunable output means to the frequency corresponding to said input signal frequency change, to provide isolation between said output and input circuits.

5. In combination:

a transistor having base, emitter and collector electrodes, said transistor having inherent capacitance between said collector and base electrodes, means for applying input signals to said base electrode, an output circuit including an inductor and a fixed capacitor connected in a series circuit between said collector and emitter electrodes, and a variable capacitor connected across said series circuit, and a parallel resonant circuit coupled between said base electrode and the connection of said inductor and said fixed capacitor, said parallel resonant circuit being tuned below the frequency to which said output circuit is tuned by an amount such that the effective reactance of said parallel resonant circuit at the resonant frequency of said output circuit represents an effective capacitance which is substantially equal to the ratio of the product of the values of said inherent capacitance and said fixed capacitor over the value of said variable capacitance.

6. The combination comprising:

a transistor having base, emitter and collector electrodes, said transistor having inherent capacitive feedback between said collector and base electrodes, an input circuit coupled between said base and emitter electrodes, an output circuit including an inductor and a fixed capacitor connected in a series circuit between said collector and emitter electrodes, and a variable capacitor connected across said series circuit, and a series resonant circuit, including an inductor and a capacitor, coupled between said base electrode and the connection of said inductor and said fixed capacitor of said output circuit, said series resonant circuit forming, in conjuction with: (1) said inherent capacitive feedback, (2) the capacitor of said output circuit, and (3) said variable capacitor, a bridge circuit, said series resonant circuit being tuned above the frequency range to which said output circuit is tunable, said inductor and capacitor of said series resonant circuit each having a value that is a function of the ratio of the maximum value of capacitance to the minimum value of capacitance of said variable capacitor, of the maximum and minimum operating frequencies, and of the value of effective capacitance necessary to balance the bridge at said maximum frequency.

7. A tunable amplifying circuit of the type including:
an amplifier device having input, output and common electrodes with an inherent capacitance, $C_f$, between said output and input electrodes,
a tunable input circuit including,
a first, second and third reactive elements,
said first reactive element connected between said common and said input electrodes, said second and third reactive elements connected in series across said first reactive element,
said first reactive element being variable to tune said input circuit at a desired frequency of a predetermined frequency range,
reactive circuit means coupled between said output electrode and the connection of said second and third reactive elements,
said reactive circuit means comprising,
a resonant circuit tuned to a frequency so as to exhibit an effective rectance at the frequency to which said input circuit is tuned, which effective reactance together with the reactance of the first and second reactive elements and the capacitance $C_f$, forms a balance bridge circuit to neutralize said amplifier,
said effective reactance varies as said first reactive element is varied in a manner to maintain said bridge circuit substantially balanced.

8. An amplifier comprising:
an amplifying device having input, output and common electrodes,
said device having inherent capacitance between said input and output electrodes,
an input circuit coupled between said input and common electrodes,
an output circuit coupled between said output and common electrodes,
one of said input and output circuits comprising a parallel resonant network including two reactive circuit means connected in parallel with each other, one of said of two reactive circuit means having a variable reactive circuit element to tune said parallel resonant network to a desired frequency in a predetermined frequency range, and the other of said two reactive circuit means including at least two fixed reactive circuit elements connected in series with each other, and
a neutralizing circuit means coupling said output circuit and said input circuit, said neutralizing circuit means being coupled between one of said input and output electrodes and the connection of said two fixed reactive circuit means, said neutralizing circuit means including an inductor and a capacitor and being resonant at a frequency without said frequency range of said parallel resonant network, said neutralizing circuit means having a ratio of effective inductive reactance-to-effective capacitance reactance such that incremental changes of reactance of said variable reactive circuit element are respectively accompanied by incremental changes in the reactance exhibited by said neutralizing circuit means that substantially neutralize the feedback through said inherent capacitance to effectively isolate said input circuit from said output circuit.

9. A transistor having:
base, emitter and collector electrodes, said transistor having inherent capacitance between said collector and base electrodes,
an input circuit coupled between said base and said emitter electrodes,
an output circuit coupled between said collector and emitter electrodes,
one of said input and output circuits comprising, a parallel resonant network including two reactive circuit means connected in parallel with each other, one of said two reactive circuit means being a variable capacitor to tune said parallel resonant network to a desired frequency in a predetermined frequency range, and the other of said two reactive circuit means including at least one fixed capacitor and one fixed inductor connected in series with each other, and a neutralizing circuit means coupling said output circuit and said input circuit, said neutralizing circuit means being coupled between one of said base and collector electrodes and the connection of said fixed capacitor and said fixed inductor, said neutralizing circuit means comprising an inductor and a capacitor connected in parallel with each other, said neutralizing circuit means being resonant at a frequency below the tunable frequency range of said amplifier, so that said neutralizing circuit means exhibits a capacitive reactance that varies as a function of the variation of said variable capacitor, and neutralizes the feedback through said inherent capacitance, said inductor having a value that is equal to $$\frac{K(\omega_2^2-\omega_1^2)}{(K-1)C_N\omega_1^2\omega_2^2}$$

and the capacitor of said neutralizing network having the value that is equal to $$\frac{C_N(\omega_2^2K-\omega_1^2)}{K(\omega_2^2-\omega_1^2)}$$

where $C_N$ is the necessary capacitance that said neutralizing network must exhibit to balance bridge at the maximum frequency of said frequency range, K is equal to the ratio of the maximum value to the minimum value of said variable capacitor, $\omega_2$ is equal to $2\pi$ times the largest tunable frequency, and $\omega_1$ is equal to $2\pi$ times the minimum tunable frequency.

10. In combination:
a transistor having base, collector and emitter electrodes and having inherent capacitance $C_f$ between said base and collector electrodes,
a tunable input circuit including first and second reactive circuit elements,
means coupling said input circuit between said base and emitter electrodes,
said first reactive element being a variable capacitor $C_b$ to tune said input circuit to a desired frequency in a predetermined frequency range,
neutralizing circuit means coupled between said collector and base electrodes,
said first reactive element $C_b$, said inherent capacitive $C_f$, said second reactive element, and said neutralizing circuit means forming a bridge circuit,
said neutralizing circuit means comprising, a series resonant circuit including a capacitor $C_1$ and an inductor $L_1$, said neutralizing circuit means being resonant at a frequency without said range of frequencies at which said input circuit is tunable, so that said neutralizing circuit means exhibits a capacitive reactance throughout said frequency range,
said inductor $L_1$ having a value of inductance that is equal to $$\frac{K-1}{C_N(\omega_2^2-\omega_1^2)}$$

and said capacitor $C_b$ having a value of capacitance that is equal to $$\frac{C_N(\omega_2^2-\omega_1^2)}{K\omega_2^2-\omega_1^2}$$

where $C_N$ is the necessary capacitance to balance said bridge circuit at the maximum frequency of said frequency range, $\omega_2$ is equal to $2\pi$ times the highest frequency of said frequency range, $\omega_1$ is equal to $2\pi$ times the lowest frequency of said frequency range, and K is the ratio of the maximum value of said capacitor $C_b$ to the minimum value of said same capacitor $C_b$, and output circuit means coupled between said collector electrode and said base electrode.

11. A tunable amplifying circuit of the type including:

an amplifier device having input, output and common electrodes with inherent capacitance between said input and output electrodes, an input circuit coupled between said input and common electrodes for receiving input signals, a tunable output circuit coupled between said output and common electrodes including a variable reactive circuit element to tune said output circuit throughout a predetermined operating frequency range, and a neutralizing resonant circuit including inductive and capacitive reactive circuit elements coupled between said output and input circuits, said neutralizing circuit being resonant at a frequency without said operating frequency range so that it exhibits a reactance throughout said frequency range, said reactance being the type reactance exhibited by said variable reactive circuit element, said resonant circuit having an $L/C$ ratio such that incremental changes in the reactance of said variable reactive circuit element are substantially compensated respectively by incremental changes in the effective reactance of said neutralizing resonant circuit.

References Cited by the Examiner

UNITED STATES PATENTS

| | | | |
|---|---|---|---|
| 1,757,494 | 5/1930 | Wheeler | 330—76 |
| 1,764,564 | 6/1930 | Hull | 330—76 |
| 2,013,098 | 9/1935 | Hansell | 330—77 |
| 2,841,655 | 7/1958 | Horowitz | 330—76 |
| 2,927,277 | 3/1960 | Chu | 330—27 |
| 2,949,580 | 8/1960 | Eland | 330—79 |
| 3,094,674 | 6/1963 | Sparks | 330—76 |

OTHER REFERENCES

Ryder: Networks, Lines and Fields, Prentice-Hall, Englewood Cliffs, N.J., QC 601 R9, 2nd ed., 1955, pages 77–80 relied on.

ROY LAKE, *Primary Examiner.*

T. M. WEBSTER, R. P. KANANEN, *Assistant Examiners.*